United States Patent [19]

Hori

[11] Patent Number: 5,511,101

[45] Date of Patent: Apr. 23, 1996

[54] PHASE-LOCKED LOOP SYNTHESIZER

[75] Inventor: Hidetoshi Hori, Tokyo, Japan

[73] Assignee: NEC Corporation, Japan

[21] Appl. No.: 310,843

[22] Filed: Sep. 22, 1994

[30] Foreign Application Priority Data

Sep. 22, 1993 [JP] Japan ................................ 5-236088

[51] Int. Cl.$^6$ .................................................. H03D 3/24
[52] U.S. Cl. ............................ 375/376; 331/1 A; 331/25
[58] Field of Search .................................. 375/120, 118, 375/371, 373, 375; 331/1 A, 25

[56] References Cited

U.S. PATENT DOCUMENTS 3,731,219  5/1973  Mader et al. ............................ 331/25
5,068,628  11/1991  Goshal .................................... 375/120

FOREIGN PATENT DOCUMENTS

63-28131  2/1988  Japan.

Primary Examiner—Stephen Chin
Assistant Examiner—Huong Luu
Attorney, Agent, or Firm—Ostrolenk, Faber, Gerb & Soffen

[57] ABSTRACT

To provide stable oscillation frequencies at small step intervals even with a high reference frequency, a PLL circuit of the present invention includes variable frequency oscillation means for outputting an oscillation frequency signal, pulse train generating means receiving the oscillation frequency signal as a clock signal, for converting a train of n clocks to m pulses where n and m are positive integers, generating sequential pulses produced by arranging part of the m pulses so that they have non-uniform numbers of clocks, and outputting m periodical, sequential pulse trains so that the pulses having the non-uniform numbers of clocks are arranged differently, phase comparing means for outputting a phase error signal by determining a phase error between the reference frequency signal and the oscillation frequency signal based on the reference frequency signal and the m sequential pulse trains, and filtering means for filtering the phase error signal to produce a frequency control signal, and supplying the frequency control signal to the variable frequency oscillation means.

26 Claims, 7 Drawing Sheets

PHASE-LOCKED LOOP SYNTHESIZER

BACKGROUND OF THE INVENTION

The present invention relates to a synthesizer using a PLL (phase-locked loop) circuit, which is hereinafter called a PLL synthesizer. More specifically, the invention relates to a PLL synthesizer which can provide oscillation frequencies at small step intervals and which responds in a sufficiently short time.

Figure 1:
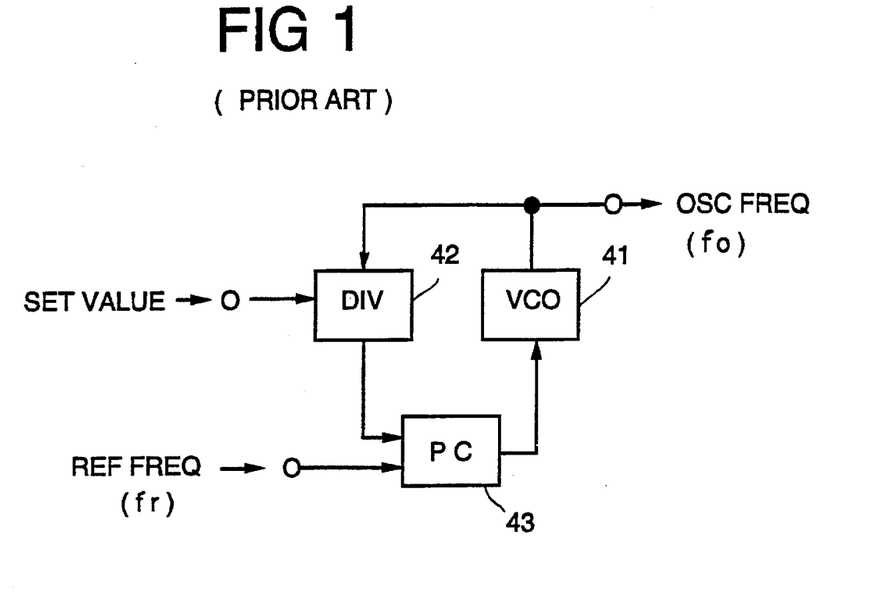
FIG. 1 is a block diagram showing an example of prior art PLL synthesizers.

FIG. 1 shows a well known PLL oscillation circuit. This PLL oscillation circuit has a voltage-controlled oscillator (VCO) 41 with an oscillation frequency that can be operated by a control voltage. It also has a frequency divider (DIV) 42 for dividing the frequency of a signal supplied from the voltage-controlled oscillator 41 at a dividing ratio set by an input set value. Finally, the circuit has a phase comparator (PC) 43 to perform a phase comparison between an output signal of the frequency divider 42 and a reference frequency signal. It also supplies the voltage-controlled oscillator 41 with a phase error signal as the control voltage. The phase comparator 43 has a filter which can interrupt pulse-like signal components occurring in every phase comparison.

In this PLL oscillation circuit, an oscillation frequency fo is given by fo=k×fr where k is the dividing ratio of the frequency divider 42 and fr is a frequency of the reference frequency signal. Since the dividing ratio k is a positive integer, this PLL oscillation circuit provides oscillation frequencies at a step interval of fr.

Oscillation frequencies with smaller step intervals can be obtained with this PLL oscillation circuit by reducing the reference frequency fr. However, if the reference frequency fr is reduced, the cutoff frequency of the filter of the phase comparator 43 can also be lowered. If the cutoff frequency of the filter of the phase comparator 43 is reduced, the time constant of the filter is increased, which elongates the response time until stabilization of the output. That is, this PLL oscillation circuit has a problem that if it is attempted to obtain oscillation frequencies with smaller step intervals, the response time until stabilization of the output in response to switching of the oscillation frequency becomes longer.

Figure 2:
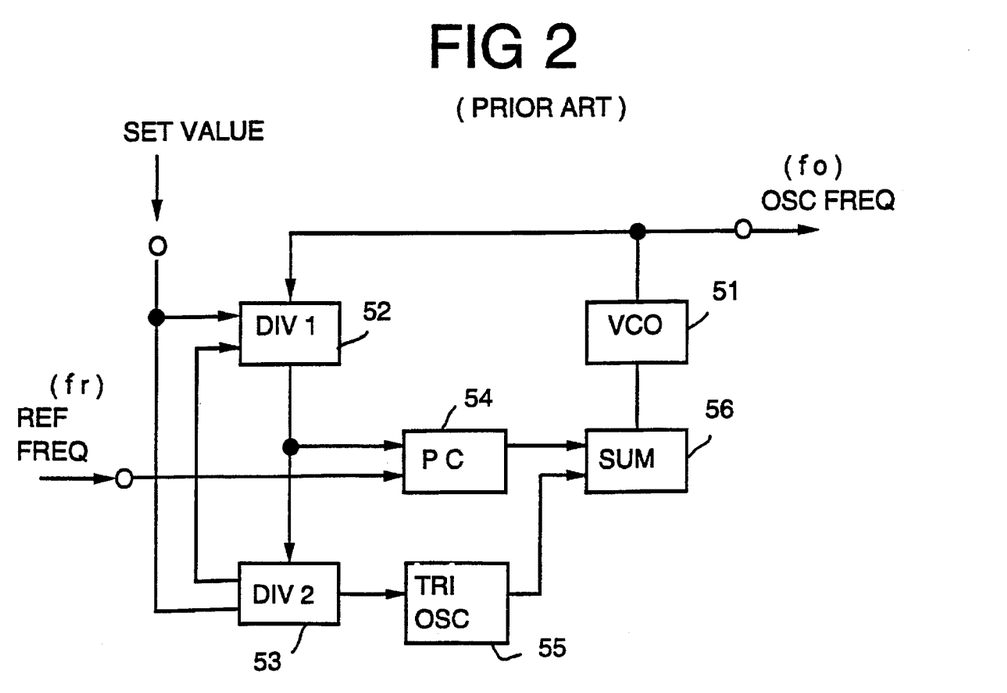
FIG. 2 is a block diagram showing another example of prior art PLL synthesizers.

FIG. 2 shows a conventional PLL oscillation circuit that has solved the above problem. This PLL oscillation circuit has the following components. Reference numeral 51 denotes a voltage-controlled oscillator (VCO). A first frequency divider (DIV1) 52 divides an oscillation frequency fo of an output signal of the voltage-controlled oscillator 51 at a ratio of k (positive integer). A second frequency divider (DIV2) 53 further divides the frequency of an output signal of the first frequency divider 52. A phase comparator (PC) 54 compares the phase of the output signal of the first divider 52 with that of a reference frequency signal. A triangular wave oscillator (TRI OSC) 55 generates a triangular wave based on a frequency-divided signal as output from the second frequency divider 53. An adder (SUM) 56 adds the output signals of the phase comparator 54 and the triangular oscillator 55.

In this PLL oscillation circuit, the frequency of the signal input to the first frequency divider 52 is usually divided at a ratio of k or k+j (j is an integer other than 0). The frequency-divided signal is input to the phase comparator 54, where it is subjected to phase comparison with the reference frequency (fr) signal. On the other hand, the frequency-divided signal output from the first frequency divider 52 is input to the second frequency divider 53, where it is subjected to frequency division at a ratio s. The frequency-divided signal as output from the second frequency divider 53 is input to the triangular wave oscillator 55. Further, the second frequency divider 53 supplies a switching signal to the first frequency divider 52 at a predetermined timing to effect switching between the frequency division of k and that of k+j.

The triangular wave oscillator 55 generates a triangular wave with a period T based on the frequency-divided signal supplied from the second frequency divider 53. The output signal from the phase comparator 54 and the triangular wave from the triangular wave oscillator 55 are subjected to addition (or subtraction) in the adder 56. As a result, a varying signal, having the period T, is removed from the output signal of the phase comparator 54. An output signal from the adder 56 is supplied, as a frequency control signal, to the voltage-controlled oscillator 51.

In the case with frequency division of k+j where j=1 and the first frequency divider 52 performs m times of frequency division of k+1 and s−m times of frequency division of k. Then, the output frequency fo is expressed as $$fo = \left\{ \frac{(k+1)}{s} m + \frac{k}{s}(s-m) \right\} \times fr = \left\{ k + \frac{m}{s} \right\} \times fr.$$

It is understood that oscillation frequencies can be obtained with the step interval fr/s. That is, it is possible to obtain oscillation frequencies with small step intervals without reducing the frequency fr of the reference frequency signal. This type of PLL oscillation circuit is, for example, disclosed in Japanese Unexamined Patent Publication No. Sho. 63-28131 (1988).

However, the above method for decreasing the step intervals of oscillation frequencies by using a triangular wave has the following problem. Since the frequency division number of the period T depends on the oscillation frequency, an error in the oscillation frequency of the triangular wave directly deteriorates the stability of the oscillation frequency of the voltage-controlled oscillator 51.

SUMMARY OF THE INVENTION

An object of the present invention is to provide, by solving the above-described problems, a PLL circuit which can stably oscillate to provide oscillation frequencies having small step intervals even with a high reference frequency.

To attain the above object, according to the invention, a PLL circuit comprises variable frequency oscillation means for outputting an oscillation frequency signal, pulse train generating means for generating a plurality of non-uniform pulse trains that vary periodically on a time series by using the oscillation frequency signal as a clock signal, phase comparing means for outputting a phase error signal by determining a phase error between an input reference frequency signal and the oscillation frequency signal based on the reference frequency signal and the plurality of sequential pulse trains, and filtering meads for filtering the phase error signal to produce a frequency control signal, and supplying the frequency control signal to the variable frequency oscillation means.

BRIEF DESCRIPTION OF THE DRAWINGS

The present invention will be described below in further detail with reference to the accompanying drawings, in which.

DESCRIPTION OF THE PREFERRED EMBODIMENTS

Figure 3:
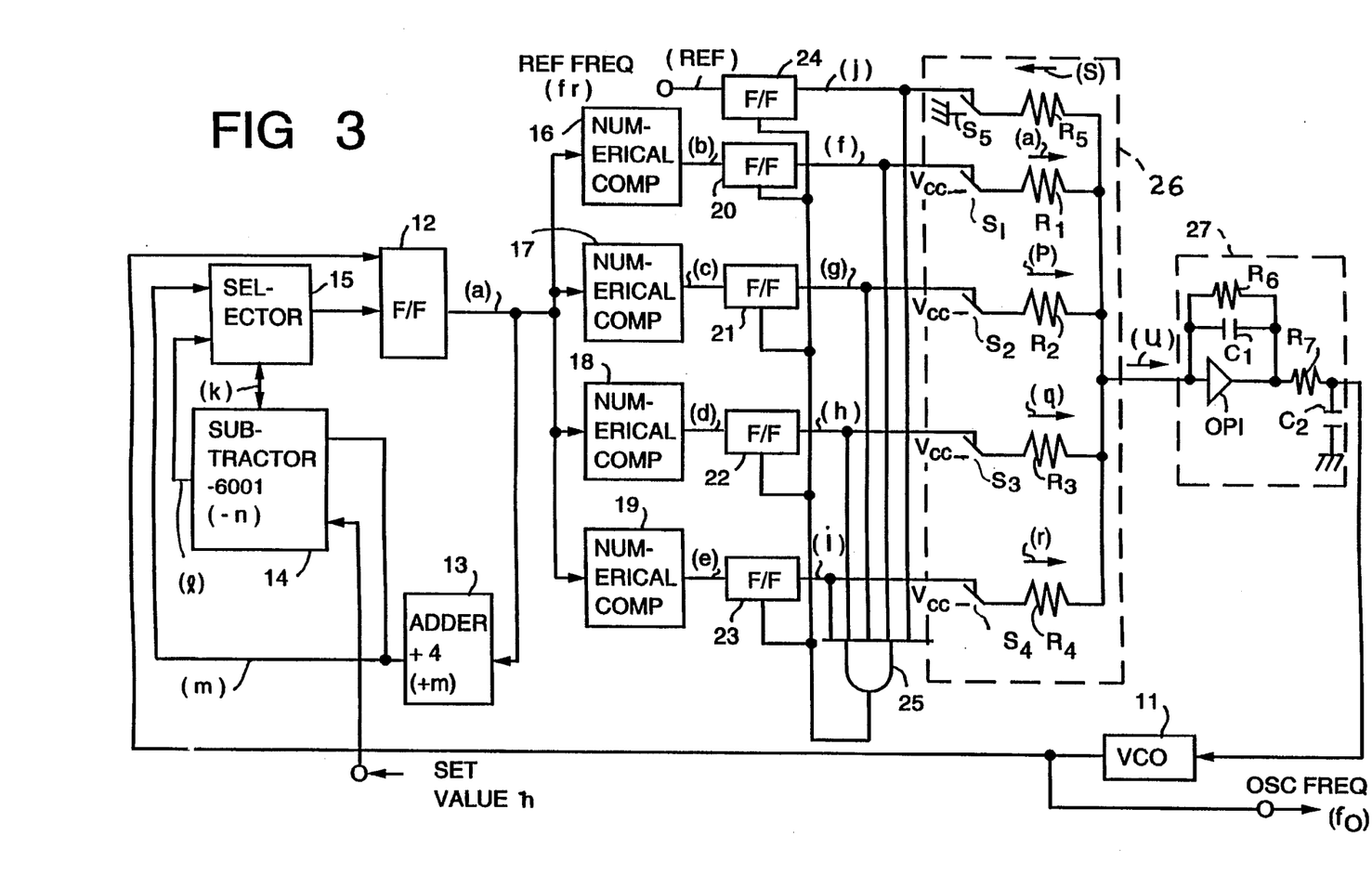
FIG. 3 is a block diagram showing a first embodiment of the present invention.

A first embodiment of a PLL circuit according to the present invention will be described. FIG. 3 shows the first embodiment of the invention. A PLL oscillation circuit of FIG. 3 has a voltage-controlled oscillator (VCO) 11, a flip-flop (F/F) 12, an adder 13, a subtracter 14, a selector 15, numerical comparators 16 through 19, flip-flops (F/F's) 20 through 24, a gate section 25, a combining section 26, and a filtering section 27.

The operation of the PLL oscillation circuit of this embodiment will be described below with reference to FIGS. 3 through 6. In FIG. 3, each flip-flop 12, adder 13, subtracter 14, selector 15, and the numerical comparators 16 through 19 can deal with numerical values of, for instance, 13 bits (the maximum number of bits necessary to operate this embodiment). The adder 13 adds a predetermined value m (in this embodiment, m=4, which is equal to the number of the numerical comparators 16 through 19) to a numerical value output from the flip-flop 12, and outputs an additional result. The output m of the adder 13 is input to the subtracter 14 and the selector 15. The subtracter 14 subtracts a preset value n (n is a positive integer between 520 and 8188 in the configuration of FIG. 3) from the numerical value output of the adder 13, and supplies a subtraction result to the selector 15. The number 520 is the maximum of preset values 516, 515, 514 and 513 (described later) of the respective numerical comparators 16 through 19 plus m=4. The number 8188 is the maximum number 8192 expressed by 13 bits (the maximum number of bits that can be dealt with in this embodiment) minus m=4. The selector 15 is controlled by an output k of the subtracter 14 to select the output m of the adder 13 when the output of the subtracter 14 is negative, and selects the output l of the subtracter 14 when the output of the subtracter 14 is zero or positive. The flip-flop 12 receives the numerical value as selected by the selector 15 with an output of the voltage-controlled oscillator 11 used as a clock signal, and outputs the received value at a timing of the next clock.

Figure 4:
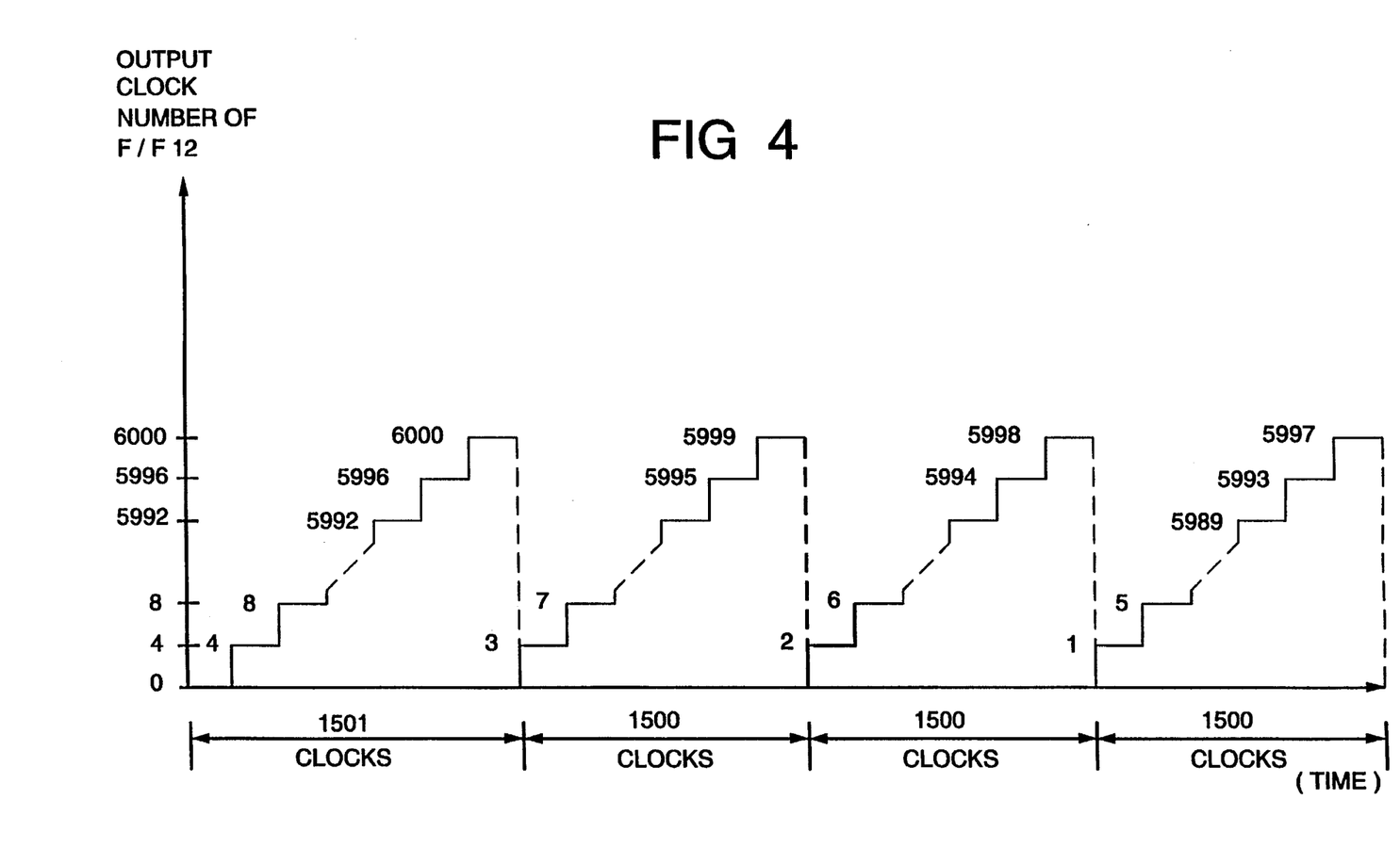
FIG. 4 shows a temporal variation of the clock number in the output of a flip-flop 12 of the first embodiment shown in FIG. 3.
Figure 5:
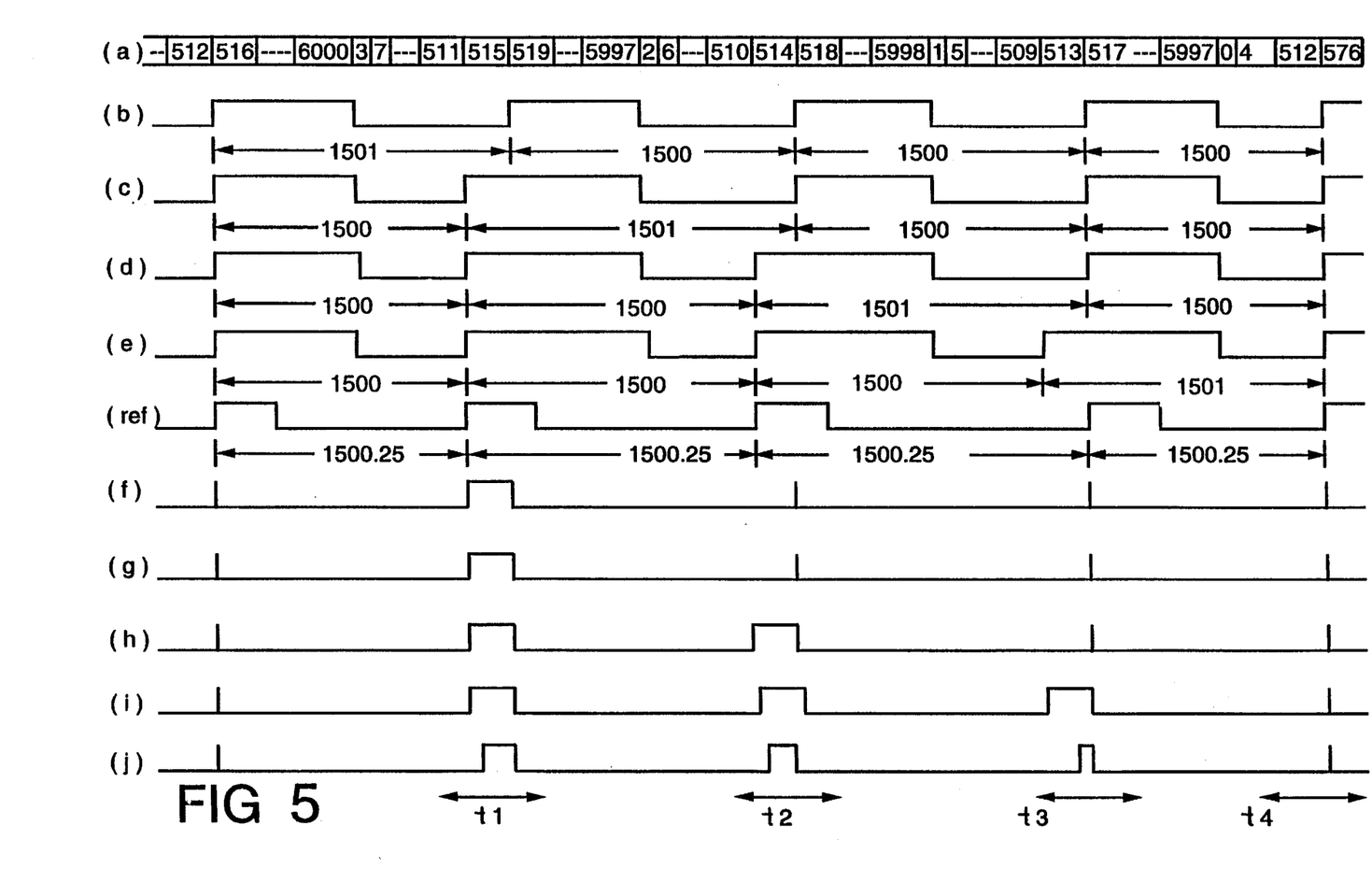
FIG. 5 shows waveforms appearing at respective parts in the first embodiment.

For example, if the initial output of the flip-flop 12 is 0 and the preset value n is 6001, the output m of the adder 13 increases to take, in order, the values 4, 8, ..., 6000, 6004, .... On the other hand, the output l of the subtracter 14 increases to take, in order, the values −5997, −5993, ..., −1, 3, .... The selector 15 selects the output m of the adder 13 when the output l of the subtracter 14 is negative. It selects the output l of the subtracter 14 when the output l of the subtracter 14 is zero or positive. Therefore, in this case, the output of the selector 15 takes, in order, the values 4, 8, ..., 6000, 3, 7, .... That is, the output of the selector 15 is expressed as $$X_i = X_{i-1} + 4 \pmod{n}$$

where $X_i$ is a current output value, $X_{x-1}$ is an output value at a one-clock preceding timing and mod n is abbreviation of modulo-n. The flip-flop 12 outputs the output of the selector 15 at a prescribed timing as described in FIG. 4. With the above operation, the flip-flop 12 produces an output as shown in part (a) of FIG. 5.

The numerical value output from the flip-flop 12 is input to a plurality of (4 in this embodiment) numerical comparators 16 through 19. Four different detection thresholds (which increase or decrease in order one by one) are set in the respective numerical comparators 16 through 19. Each of the numerical comparators 16 through 19 outputs a high-level (H) signal when the numerical value received from the flip-flop 12 is equal to or larger than the detection threshold.

For example, assume here that the flip-flop 12 produces the output as shown in part (a) of FIG. 5 and detection thresholds of 516, 515, 514 and 513 are set in the respective numerical comparators 16 through 19. In this case, the numerical comparators 16 through 19 have output waveforms as shown in parts (b) to (e) of FIG. 5, respectively. As is apparent from these figures, the output waveform of each of the numerical comparators 16 through 19 is a non-uniform, sequential pulse train in which pulses having a repetition period of 1500 clocks and a pulse having a repetition period of 1501 clocks are periodically repeated. Further, the pulses having the period of 1501 clocks of the numerical comparators 16 through 19 appear at different timings.

Numerical comparators 16 through 19 are connected to the flip-flops 20 through 23, respectively, and the sequential pulse signals from the numerical comparators 16 through 19 render the flip-flops 20 through 23 in set states at their rise timings. On the other hand, receiving a reference frequency signal, the flip-flop 24 is rendered in a set state at its rise timings.

Each flip-flops 20 through 24 outputs a high-level (H) signal when it is in the set state. The outputs of the flip-flops 20 through 24 are input to the gate section 25. The gate section 25 outputs a reset signal when all of the outputs of the flip-flops 20 through 24 are at the high level. The flip-flops 20 through 24 are rendered in reset states by this reset signal.

Assume here that the PLL oscillation circuit of this embodiment is in a steady-state operation with an oscillation frequency that is, for instance, 1500.25 times the reference frequency fr. The number 1500.25 is equal to n/m when n=6001 and m=4. The reference frequency signal is shown in part (ref) of FIG. 5. In this case, the flip-flops 20 through 24 produce outputs as shown in part (f) to (j) of FIG. 5, respectively.

The outputs of the flip-flops 20 through 24 are also input to the combining section 26. The combining section 26 consists of resistors $R_1$ to $R_5$ and semiconductor switches $S_1$ to $S_5$ that are connected to the respective flip-flops 20 through 25 and are closed when the corresponding flip-flop is in a set state. The semiconductor switches $S_1$ to $S_4$ are connected to power supplies and the semiconductor switch $S_5$ is connected to ground. A current flowing through the semiconductor switches $S_1$ to $S_4$ and a current flowing through the semiconductor switch $S_5$ is in an opposite direction. The same resistance R of the resistors $R_1$ to $R_4$ and a resistance r of the resistor $R_5$ has a relationship R=4r. Therefore, the sum of the currents flowing through the resistors $R_1$ to $R_5$ becomes zero.

Figure 6:
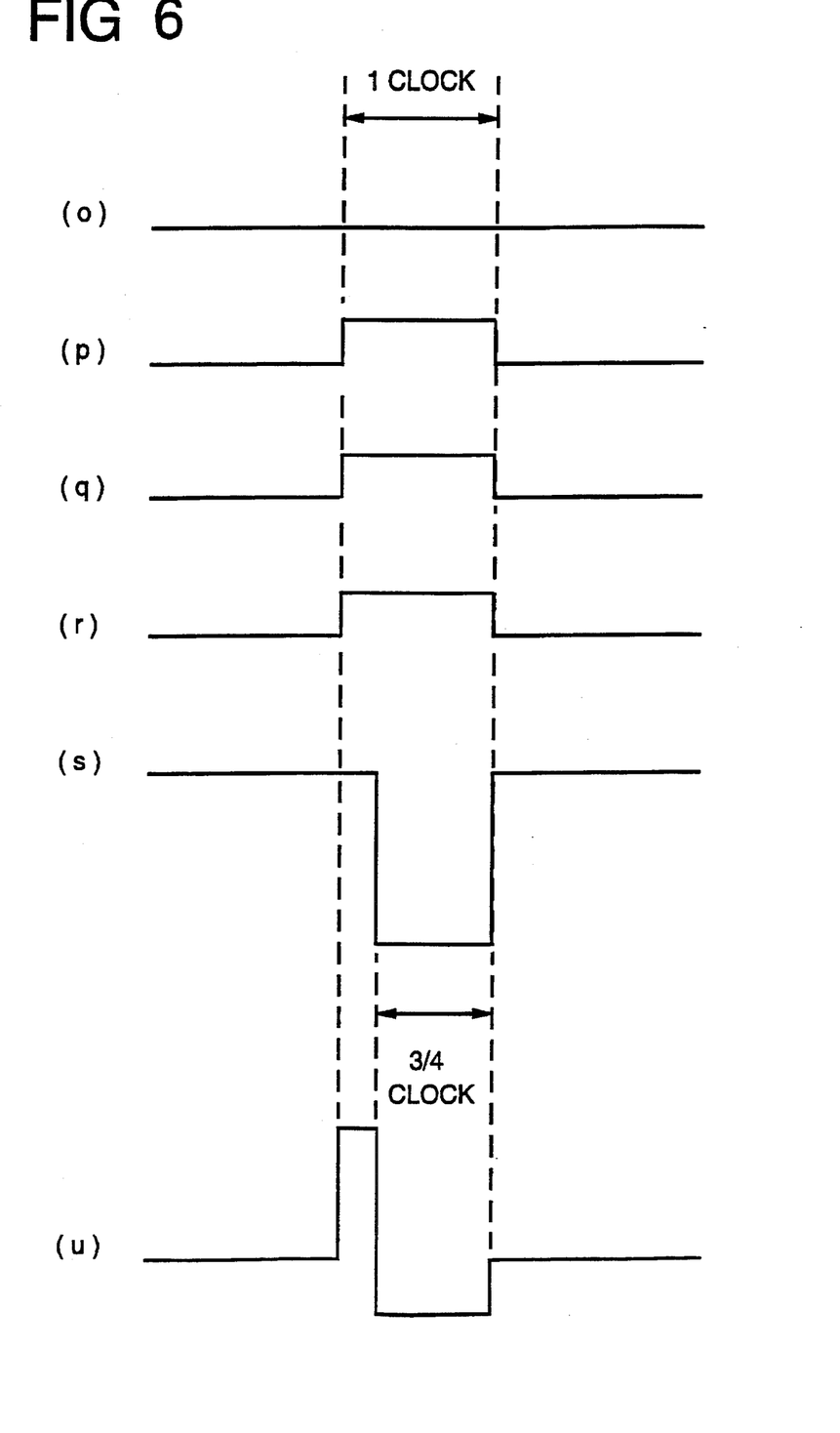
FIG. 6 shows current waveforms appearing at respective positions in a synthesizing section 26 of the first embodiment.

For example, at a timing t1 shown in FIG. 5, currents shown in parts (o) to (s) of FIG. 6 flow through the resistors $R_1$ to $R_5$, respectively. The combining section 26 outputs the sum of the currents shown in parts (o) to (s) of FIG. 6 as a phase error signal. The phase error signal has a waveform shown in part (u) of FIG. 6. In this embodiment, when the PLL oscillation circuit is in the steady state, an electricity amount (a current value multiplied by its continuation time) flowing through all of the resistors $R_1$ to $R_4$ and that flowing through the resistor $R_5$ cancel out each other, so that an electricity amount of the phase error signal is zero. Similarly, at each of timings t2, t3 and t4, the electricity amount flowing through all of the resistors $R_1$ to $R_4$ and that flowing through the resistor $R_5$ cancel out each other, so that the phase error signal output from the combining section 26 has an electricity amount of zero. When the PLL oscillation circuit is not in the steady state, the electricity amount is a positive or negative value. The phase error signal obtained in the above manner does not have the components having non-uniform repetition periods of the sequential pulse trains that are the outputs of the flip-flops 20 through 23.

The phase error signal as output from the combining section 26 is input to the filtering section 27. Having an operational amplifier OP1, resistors $R_6$ and $R_7$, and capacitors $C_1$ and $C_2$, the filtering section 27 so set as to sufficiently smooth variation components of the phase error signal and to give a proper time constant to the PLL oscillation circuit. Since the phase error signal output from the combining section 26 does not include the components of the non-uniform repetition periods of the sequential pulse trains that are the outputs of the flip-flops 20 through 23, the time constant of this PLL oscillation circuit may be set so as to sufficiently suppress the component of the reference frequency fr, which is constant. There does not exist a problem that the time constant is so large that it takes long time for the oscillation frequency to become stable. As a result, a deviation of the oscillation frequency of the voltage-controlled oscillator 11 appears as phase shifts of the sequential pulse trains. A PLL loop is formed by negatively feeding back, to the voltage-controlled oscillator 11, the phase error signal obtained by comparing those pulse trains with the reference frequency signal.

The oscillation frequency fo of this PLL oscillation circuit is given by fo=n×(fr/m) where m is a positive integer representing the addition value of the adder 13, n is the setting value of the subtracter 14, and fr is the reference frequency. That is, the step interval of oscillation frequencies of this PLL oscillation circuit is fr/m. In this embodiment, in which m=4 and n=6001, fo is calculated as $$fo=n\times(fr/m)=6001\times(20\times10^3/4)=30.005 \text{ (MHz)}$$

where fr is assumed to be 20 kHz. In this case, the step interval of oscillation frequencies is 20/4=5 kHz.

Although the step interval of oscillation frequencies is reduced to 5 kHz, it suffices that the time constant of the filtering section 27 is selected to be such a value as can suppress the component of the reference frequency fr. This enables formation of a synthesizer without elongating the response time. As a result, arbitrary oscillation frequencies can be obtained by changing the setting value n and the addition value m.

In the embodiment described above, the adder 13 adds 4 to the output of the flip-flop 12, and the setting value n is subtracted from the addition output. Alternatively, 4 may be subtracted from the output of the flip-flop 12 by a subtracter, the output of the subtracter being summed with the setting value n.

Figure 7:
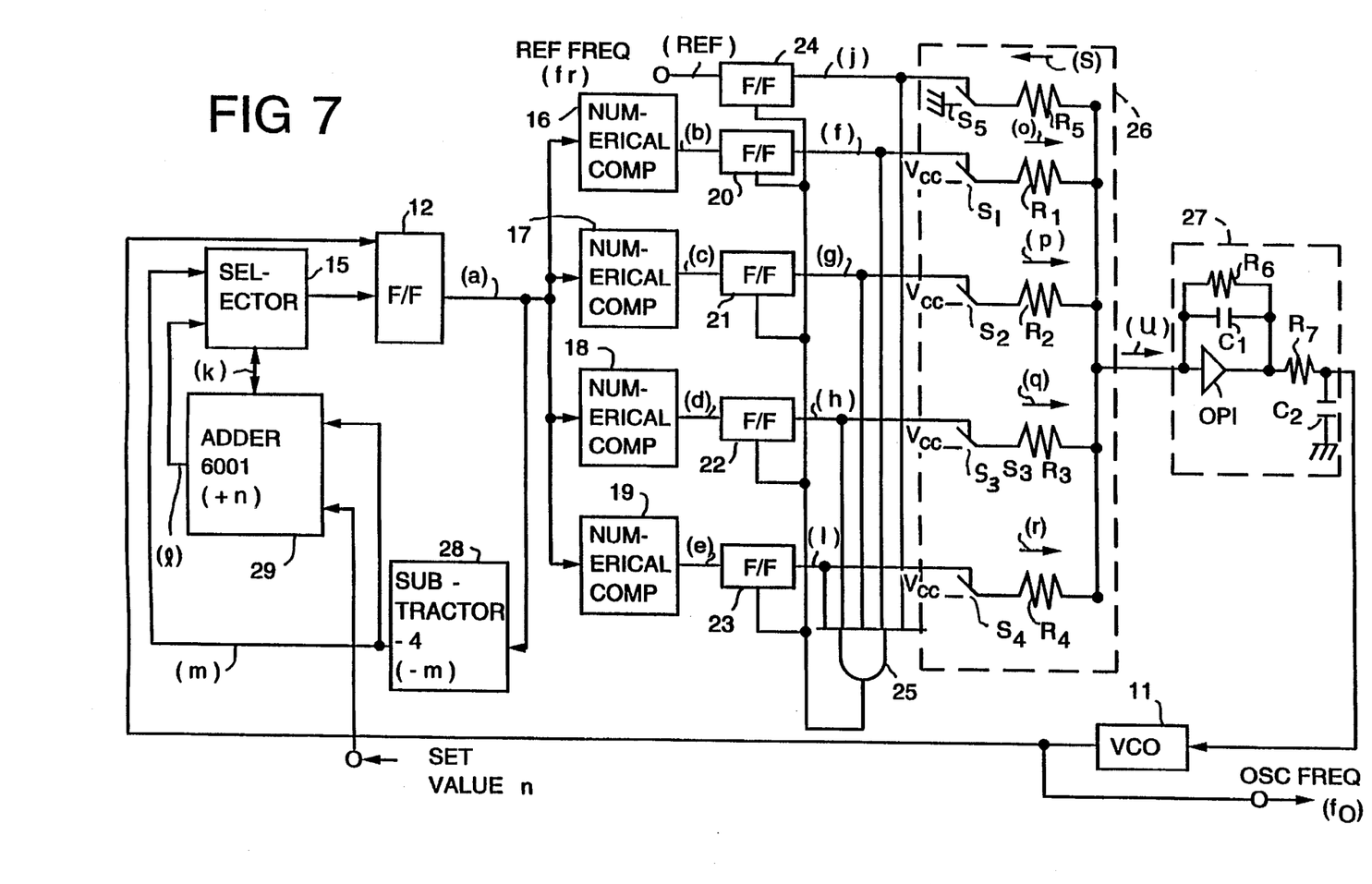
FIG. 7 is a block diagram showing a second embodiment of the present invention.

FIG. 7 shows a second embodiment of the present invention, which is the same as the first embodiment of FIG. 3 except that a subtracter 28 and an adder 29 are used instead of the adder 13 and the subtracter 14.

If it is assumed that the initial output of the flip-flop 12 is 6000, and the setting value n is 6001, the output of the subtracter 28 decreases to take, in order, the values 5996, 5992, . . . , 0, −4, −8 . . . . On the other hand, the output of the adder 29 decreases to take, in order, the values 11997, 11993, . . . , 6001, 5997, . . . . The selector 15 selects the output of the subtracter 28 if the output of the adder 29 is larger than, or equal to 6001 setting value n, and selects the output of the adder 29 if it is smaller than 6001. As a result, the output of the selector 15 takes, in order, the values 5996, 5992, . . . , 0, 5997, 5993, . . . . That is, the output of the selector 15 is expressed as $$X_i = X_{i-1} - 4 \pmod{n}$$

where $X_i$ is a current output value and $X_{i-1}$ is an output value at a one-clock preceding timing.

Although in the above-described embodiments the addition value m of the adder 13 is set at 4, the invention is not limited to this case.

Figure 8:
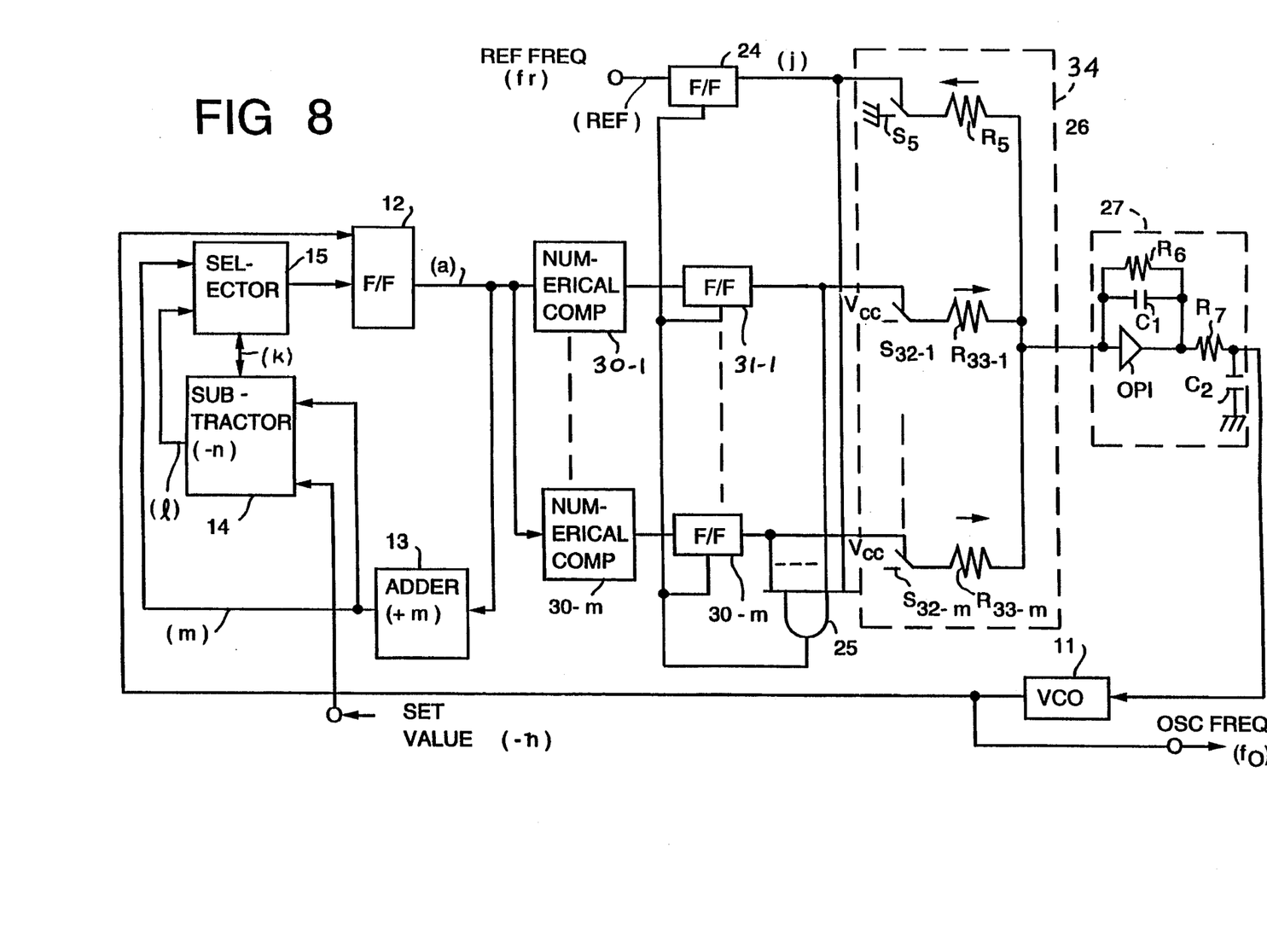
FIG. 8 is a block diagram showing a third embodiment of the present invention.

For example, FIG. 8 shows a generalized configuration in which numerical comparators 30-1 through 30-m, flip-flops 31-1 through 31-m, switches 32-1 through 32-m, and resistors 33-1 through 33-m are provided by the same number as the addition value m. In this case, a relationship $$R_{33-1}=R_{33-2}=\ldots=R_{33-3}m=m\times R_5$$

is established in consideration of the current balance.

In the above embodiments, the thresholds of the numerical comparators 16 through 19 are set at 516, 515, 514 and 513, respectively, with the result that the output waveform of each numerical comparator has pulses having the repetition period of 1500 clocks and pulses having the repetition period of 1501 clocks. The above consecutive thresholds are selected to facilitate the detection of the phase error signal. However, the invention is not limited to this case, but other numbers smaller than the setting value n may be selected in which case the resistances $R_1$ to $R_5$ are selected so that the phase error signal detected by the combining section 26 does not include the components of non-uniform repetition periods.

What is claimed is:

1. A phase-locked loop (PLL) circuit for producing an oscillation frequency signal having an oscillation frequency that is phase-locked with a reference frequency signal having a predetermined reference frequency, comprising:

variable frequency oscillation means outputting the oscillation frequency signal (fo);

pulse train generating means receiving said oscillation frequency signal as a clock signal, said pulse train generating means converting a train of n clock signals to m pulses where n and m are positive integers, and generating sequential pulses produced by arranging part of the m pulses having non-uniform numbers of clocks, and outputting m periodical, sequential pulse trains so that timing of said m pulses produced by different numbers of clocks divided from said n clock signals are arranged non-uniformly;

phase comparing means outputting a phase error signal by determining said phase error signal between said reference frequency signal and said m sequential pulse trains, respectively, and by combining respective phase error signals; and filtering means filtering said phase error signal to produce a frequency control signal, and providing said frequency control signal to said variable frequency oscillation means.

2. The PLL circuit according to claim 1, wherein said oscillation frequency (fo) is expressed as fo=n×(fr/m) where fr is the reference frequency.

3. The PLL circuit according to claim 1, wherein said filtering means has a time constant suppressing a component of said reference frequency.

4. The PLL circuit according to claim 1, wherein said pulse train generating means comprises:

a first flip-flop receiving said oscillation frequency signal as the clock signal, for taking in a selected output of a selector;

an adder for adding m to an output of said first flip-flop;

a subtracter for subtracting n from the output of said adder;

a selector for selecting the output of said adder when the output of said Subtracter is negative, and selecting the output of said subtracter when the output of said subtracter is zero or positive, and supplying the selected output to said first flip-flop; and m numerical comparators for comparing the output of said first flip-flop with m different thresholds, and outputting said m sequential pulse trains.

5. The PLL circuit according to claim 4, wherein said phase comparing means comprises:

m second flip-flops that are rendered in set states when receiving pulses of said m sequential pulse trains supplied from said m numerical comparators, respectively;

a third flip-flop that is rendered in a set state when receiving pulses of the reference frequency signal;

a gate circuit for supplying a reset signal to said second and third flip-flops when all of said second and third flip-flops are in the set states; and a combining means for producing the phase error signal by combining output signals of said second and third flip-flops.

6. The PLL circuit according to claim 5, wherein said combining means comprises:

m+1 switches respectively connected to said second and third flip-flops, and controlled respectively by an output signal of said second and third flip-flops; and m+1 resistors respectively connected to the m+1 switches, and having output terminals connected together.

7. The PLL circuit according to claim 6, wherein currents flowing through said m resistors connected to said m second flip-flops and a current flowing through the resistor connected to said third flip-flop are in opposite directions, and a sum of the current flowing through said m resistors and said current flowing through the resistor connected to said third flip-flop are equal to each other.

8. The PLL circuit according to claim 6, wherein said m resistors connected to said m second flip-flops have the same resistance R and the resistor connected to said third flip-flop has a resistance r, and a relationship R=m×r holds.

9. The PLL circuit according to claim 1, wherein said pulse train generating means comprises:

a first flip-flop receiving said oscillation frequency signal as the clock signal, for taking in a selected output of a selector;

a subtracter for subtracting m from an output of said first flip-flop;

an adder for adding n to an output of said subtracter;

a selector for selecting the output of said subtracter when the output of said adder is larger than n, and selecting a value obtained by adding n from the output of said adder when the output of said adder is not larger than n, and supplying the selected output to said first flip-flop; and m numerical comparators for comparing the output of said first flip-flop with m different thresholds, and outputting said m sequential pulse trains.

10. A phase-locked loop (PLL) circuit for producing an oscillation frequency signal having an oscillation frequency that is phase-locked with a reference frequency signal having a predetermined reference frequency, comprising:

variable frequency oscillation means outputting the oscillation frequency signal (fo);

pulse train generating means receiving said oscillation frequency signal as a clock signal, said pulse train generating means converting a train of n clock signals to m pulses where n and m are positive integers, generating sequential pulses produced by arranging part of the m pulses having non-uniform numbers of clocks, and outputting m periodical, sequential pulse trains so that said pulses having the non-uniform numbers of clocks are arranged differently;

phase comparing means outputting a phase error signal by determining a phase error between said reference frequency signal and said oscillation frequency signal based on said reference frequency (fr) signal and said m sequential pulse trains; and filtering means filtering said phase error signal to produce a frequency control signal, and providing said frequency control signal to said variable frequency oscillation means;

said oscillation frequency (fo) being expressed as fo=n× (fr/m) where fr is the reference frequency.

11. A phase-locked loop (PLL) circuit for producing an oscillation frequency signal having an oscillation frequency that is phase-locked with a reference frequency signal having a predetermined reference frequency, comprising:

variable frequency oscillation means outputting the oscillation frequency signal (fo);

pulse train generating means receiving said oscillation frequency signal as a clock signal, said pulse train generating means converting a train of n clock signals to m pulses where n and m are positive integers, generating sequential pulses produced by arranging part of the m pulses having non-uniform numbers of clocks, and outputting m periodical, sequential pulse trains so that said pulses having the non-uniform numbers of clocks are arranged differently;

phase comparing means outputting a phase error signal by determining a phase error between said reference frequency signal and said oscillation frequency signal based on said reference frequency (fr) signal and said m sequential pulse trains; and filtering means filtering said phase error signal to produce a frequency control signal, and providing said frequency control signal to said variable frequency oscillation means, said filtering means has a time constant suppressing a component of said reference frequency.

12. A phase-locked loop (PLL) circuit for producing an oscillation frequency signal having an oscillation frequency that is phase-locked with a reference frequency signal having a predetermined reference frequency, comprising:

variable frequency oscillation means outputting the oscillation frequency signal (fo);

pulse train generating means receiving said oscillation frequency signal as a clock signal, said pulse train generating means converting a train of n clock signals to m pulses where n and m are positive integers, generating sequential pulses produced by arranging part of the m pulses having non-uniform numbers of clocks, and outputting m periodical, sequential pulse trains so that said pulses having the non-uniform numbers of clocks are arranged differently;

said pulse train generating means includes;
a first flip-flop receiving said oscillation frequency signal as the clock signal, for taking in a selected output of a selector;
an adder for adding m to an output of said first flip-flop;
a subtracter for subtracting n from the output of said adder;
a selector for selecting the output of said adder when the output of said subtracter is negative, and selecting the output of said subtracter when the output of said subtracter is zero or positive, and supplying the selected output to said first flip-flop; and
m numerical comparators comparing the output of said first flip-flop with m different thresholds, and outputting said m sequential pulse trains;

phase comparing means outputting a phase error signal by determining a phase error between said reference frequency signal and said oscillation frequency signal based on said reference frequency (fr) signal and said m sequential pulse trains; and filtering means filtering said phase error signal to produce a frequency control signal, and providing said frequency control signal to said variable frequency oscillation means.

13. The PLL circuit according to claim 12, wherein said phase comparing means comprises:

m second flip-flops that are rendered in set states when receiving pulses of said m sequential pulse trains supplied from said m numerical comparators, respectively;

a third flip-flop that is rendered in a set state when receiving pulses of the reference frequency signal;

a gate circuit for supplying a reset signal to said second and third flip-flops when all of said second and third flip-flops are in the set states; and a combining means for producing the phase error signal by combining output signals of said second and third flip-flops.

14. The PLL circuit according to claim 13, wherein said combining means comprises:

m+1 switches respectively connected to said second and third flip-flops, and controlled respectively by an output signal of said second and third flip-flops; and m+1 resistors respectively connected to the m+1 switches, and having output terminals connected together.

15. The PLL circuit according to claim 14, wherein currents flowing through said m resistors connected to said m second flip-flops and a current flowing through the resistor connected to said third flip-flop are in opposite directions, and a sum of the current flowing through said m resistors and said current flowing through the resistor connected to said third flip-flop are equal to each other.

16. The PLL circuit according to claim 14, wherein said m resistors connected to said m second flip-flops have the same resistance R and the resistor connected to said third flip-flop has a resistance r, and a relationship R=m×r is maintained.

17. A phase-locked loop (PLL) circuit for producing an oscillation frequency signal having an oscillation frequency that is phase-locked with a reference frequency signal having a predetermined reference frequency, comprising:

variable frequency oscillation means outputting the oscillation frequency signal (fo);

pulse train generating means receiving said oscillation frequency signal as a clock signal, said pulse train generating means converting a train of n clock signals to m pulses where n and m are positive integers, generating sequential pulses produced by arranging part of the m pulses having non-uniform numbers of clocks, and outputting m periodical, sequential pulse trains so that said pulses having the non-uniform numbers of clocks are arranged differently;

said pulse train generating means includes;
a first flip-flop receiving said oscillation frequency signal as the clock signal, for taking in a selected output of a selector;
a subtracter for subtracting m from an output of said first flip-flop;
an adder for adding n to an output of said subtracter;
a selector for selecting the output of said subtracter when the output of said adder is larger than n, and selecting a value obtained by adding n from the output of said adder when the output of said adder is not larger than n, and supplying the selected output to said first flip-flop; and
m numerical comparators for comparing the output of said first flip-flop with m different thresholds, and outputting said m sequential pulse trains;

phase comparing means for outputting a phase error signal by determining a phase error between said reference frequency signal and said oscillation frequency signal based on said reference frequency (fr) signal and said m sequential pulse trains; and filtering means for filtering said phase error signal to produce a frequency control signal, and providing said frequency control signal to said variable frequency oscillation means.

18. A phase-locked loop (PLL) circuit for producing an oscillation frequency signal having an oscillation frequency that is phase-locked with a reference frequency signal having a predetermined reference frequency, comprising:

variable frequency oscillator outputting the oscillation frequency signal (fo);

pulse train generator receiving said oscillation frequency signal as a clock signal, said pulse train generator converting a train of n clock signals to m pulses where n and m are positive integers, and generating sequential pulses produced by arranging part of the m pulses having non-uniform numbers of clocks, and outputting m periodical, sequential pulse trains so that timing of said m pulses produced by different numbers of clocks divided from said n clock signals are arranged non-uniformly;

phase comparator outputting a phase error signal by determining said phase error signal between said reference frequency signal and said m sequential pulse trains, respectively, and by combining respective phase error signals; and a filter which filters said phase error signal to produce a frequency control signal, and provides said frequency control signal to said variable frequency oscillator.

19. The PLL circuit according to claim 18, wherein said oscillation frequency (fo) is expressed as fo=n×(fr/m) where fr is the reference frequency.

20. The PLL circuit according to claim 18, wherein said filter has a time constant suppressing a component of said reference frequency.

21. The PLL circuit according to claim 18, wherein said pulse train generator comprises:

a first flip-flop receiving said oscillation frequency signal as the clock signal, for taking in a selected output of a selector;

an adder for adding m to an output of said first flip-flop;

a subtracter for subtracting n from the output of an adder;

a selector for selecting the output of said adder when the output of said subtracter is negative, and selecting the output of said subtracter when the output of said subtracter is zero or positive, and supplying the selected output to said first flip-flop; and m numerical comparators for comparing the output of said first flip-flop with m different thresholds, and outputting said m sequential pulse trains.

22. The PLL circuit according to claim 21, wherein said phase comparator comprises:

m second flip-flops that are rendered in set states when receiving pulses of said m sequential pulse trains supplied from said m numerical comparators, respectively;

a third flip-flop that is rendered in a set state when receiving pulses of the reference frequency signal;

a gate circuit for supplying a reset signal to said second and third flip-flops when all of said second and third flip-flops are in the set states; and a combiner which produces the phase error signal by combining output signals of said second and third flip-flops.

23. The PLL circuit according to claim 22, wherein said combiner comprises:

m+1 switches respectively connected to said second and third flip-flops, and controlled respectively by an output signal of said second and third flip-flops; and m+1 resistors respectively connected to the m+1 switches, and having output terminals connected together.

24. The PLL circuit according to claim 23, wherein currents flowing through said m resistors connected to said m second flip-flops and a current flowing through the resistor connected to said third flip-flop are in opposite directions, and a sum of the current flowing through said m resistors and said current flowing through the resistor connected to said third flip-flop are equal to each other.

25. The PLL circuit according to claim 23, wherein said m resistors connected to said m second flip-flops have the same resistance R and the resistor connected to said third flip-flop has a resistance r, and a relationship R=m×r holds.

26. The PLL circuit according to claim 18, wherein said pulse train generator comprises:

a first flip-flop receiving said oscillation frequency signal as the clock signal, for taking in a selected output of a selector;

a subtracter for subtracting m from an output of said first flip-flop;

an adder for adding n to an output of said subtracter;

a selector for selecting the output of said subtracter when the output of said adder is larger than n, and selecting a value obtaining by adding n from the output of said adder when the output of said adder is not larger than n, and supplying the selected output to said first flip-flop; and m numerical comparators for comparing the output of said first flip-flop with m different thresholds, and outputting said m sequential pulse trains.

* * * * *